United States Patent
Ohuchi

(10) Patent No.: US 8,003,465 B2
(45) Date of Patent: Aug. 23, 2011

(54) METHOD OF MANUFACTURING SEMICONDUCTOR DEVICE

(75) Inventor: Masahiko Ohuchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/902,812

(22) Filed: Oct. 12, 2010

(65) Prior Publication Data

US 2011/0086477 A1    Apr. 14, 2011

(30) Foreign Application Priority Data

Oct. 13, 2009    (JP) .................................. 2009-236470

(51) Int. Cl.
*H01L 21/336* (2006.01)

(52) U.S. Cl. ............ 438/270; 257/E21.377; 257/E21.41

(58) Field of Classification Search .................. 438/156, 438/206, 209, 270, FOR. 192; 257/302, 257/329, E27.057, E27.096, E29.131, E29.262, 257/E29.274, E21.377, E21.41
See application file for complete search history.

(56) References Cited

U.S. PATENT DOCUMENTS

| | | | | |
|---|---|---|---|---|
| 4,970,580 A | * | 11/1990 | Ishii ............................. | 257/302 |
| 5,929,477 A | * | 7/1999 | McAllister et al. ........... | 257/306 |
| 7,449,354 B2 | * | 11/2008 | Marchant et al. ............... | 438/39 |
| 7,871,913 B2 | * | 1/2011 | Shin et al. ...................... | 438/589 |
| 2008/0001220 A1 | * | 1/2008 | Bhalla et al. .................... | 257/330 |
| 2009/0065856 A1 | * | 3/2009 | Oyu et al. ....................... | 257/329 |
| 2009/0159964 A1 | * | 6/2009 | Lee ................................ | 257/329 |
| 2010/0059816 A1 | * | 3/2010 | Shimada et al. ............... | 257/334 |
| 2010/0078698 A1 | * | 4/2010 | Son et al. ....................... | 257/296 |

FOREIGN PATENT DOCUMENTS

| | | |
|---|---|---|
| JP | 9-321289 | 12/1997 |
| JP | 11-214677 | 8/1999 |
| JP | 2008-300623 | 12/2008 |
| JP | 2009-081377 | 4/2009 |

* cited by examiner

*Primary Examiner* — George Fourson
(74) *Attorney, Agent, or Firm* — Young & Thompson

(57) ABSTRACT

A semiconductor device manufacturing method may include the following processes. A semiconductor substrate is partially removed using a first insulating film having first and second portions as a mask to form first and second pillars of the semiconductor substrate. A second insulating film is formed on side surfaces of the first and second pillars. A silicon film is formed on the first and second insulating films. A first part of the silicon film, which is on upper surfaces of the first and second portions, is removed. A coating film, which covers the upper surfaces of the first and second portions, is formed over the semiconductor substrate. The coating film is partially removed to expose the first insulating film and a second part of the silicon film. The second part is on side surfaces of the first and second portions. The second part is removed by dry etching.

14 Claims, 8 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device.

Priority is claimed on Japanese Patent Application No. 2009-236470, filed Oct. 13, 2009, the content of which is incorporated herein by reference.

2. Description of the Related Art

Recently, with the demands for higher integration and higher performance of semiconductor integrated circuits, semiconductor devices have been further miniaturized. On the other hand, with the miniaturization of semiconductor devices, it has been becoming more difficult to prevent the short channel effect of planar MOS transistors.

To solve the above problem, Japanese Patent Laid-Open Publication No. 2008-300623 and No. 2009-081377 disclose vertical MOS transistors instead of planar MOS transistors. The vertical MOS transistor includes a gate electrode covering a side surface of a semiconductor pillar. According to the structure, channel regions of the transistor are positioned in a direction perpendicular to a main surface of the semiconductor substrate. For this reason, the sufficient gate length can be achieved without increasing the occupied area of the transistor, thereby achieving a miniaturized transistor that can prevent the short channel effect.

As a method for achieving higher performance of planar MOS transistors, Japanese Patent Laid-Open Publication No. H09-321289 discloses a dual gate CMOS structure including an NMOS transistor and a PMOS transistor. The NMOS transistor includes a gate electrode containing an n-type impurity. The PMOS transistor includes a gate electrode containing a p-type impurity.

As a method of manufacturing the above semiconductor device, Japanese Patent Laid-Open Publication No. H11-214677 discloses a method of selectively ion-implanting impurities into a PMOS transistor and an NMOS transistor through a pattern that defines shapes of gate electrodes. According to the method, an impurity can be doped into only a poly-silicon film that will form a gate electrode. For this reason, poly-silicon films, which will form elements other than the gate electrode, can be processed, thereby enabling stable processing when the gate electrode is formed.

As explained above, even when vertical MOS transistors are used, higher performance of semiconductor devices can be achieved thanks to the dual gate CMOS structure.

However, the methods of the related art for manufacturing the vertical MOS transistors have a problem that it has been difficult to control the heights of the gate electrodes of the NMOS and PMOS transistors. Hereinafter, an example of the method of the related art for simultaneously forming NMOS and PMOS transistors that form a vertical MOS transistor is explained.

FIG. 16 illustrates a cross-sectional view illustrating a vertical MOS transistor having a dual gate structure, which is formed by a manufacturing method of the related art. The vertical MOS transistor includes a PMOS transistor 110 and an NMOS transistor 111 which are formed on the same semiconductor substrate 101 (not shown). A first sidewall (silicon film) 107a covers a side surface of the PMOS transistor 110. A second sidewall (silicon film) 107b covers a side surface of the NMOS transistor 111.

The PMOS transistor 110 is formed in a first region T1 of the semiconductor substrate 101 (not shown). The PMOS transistor 110 includes: a first semiconductor pillar 105a; a first mask (insulating film) 104a; a gate insulating film 106; and the first sidewall (silicon film) 107a.

The first mask (insulating film) 104a covers an upper surface of the first semiconductor pillar 105a. The gate insulating film 106 covers the side surface of the first semiconductor pillar 105a and an upper surface of a first well 102. The first sidewall 107a, which is made of a p-type poly-silicon film, covers the side surface of the first semiconductor pillar 105a through the gate insulating film 106. The first sidewall (silicon film) 107a functions as a p-type gate electrode of the PMOS transistor 110.

The NMOS transistor 111 is formed in a second region T2 of the semiconductor substrate 101 (not shown). The NMOS transistor 111 includes: a second semiconductor pillar 105b; a second mask (insulating film) 104b; the gate insulating film 106; and the second sidewall (silicon film) 107b.

The second mask (insulating film) 104b covers an upper surface of the second semiconductor pillar 105b. The gate insulating film 106 covers the side surface of the second semiconductor pillar 105b and an upper surface of a second well 103. The second sidewall 107b, which is made of an n-type poly-silicon film, covers the side surface of the second semiconductor pillar 105b through the gate insulating film 106. The second sidewall (silicon film) 107b functions as an n-type gate electrode of the NMOS transistor 111.

The first and second sidewalls (poly-silicon films) 107a and 107b are formed by anisotropic dry etching. Preferably, the anisotropic dry etching is carried out using a gas with a large etching selectivity (etching rate) of the first and second sidewalls (poly-silicon films) 107a and 107b with respect to the gate insulating film (silicon oxide film and the like) 106. Specifically, a gas containing chlorine $(Cl_2)$ may be used. By the anisotropic dry etching using a gas containing chlorine $(Cl_2)$, the first and second sidewall 107a and 107b can be selectively etched with respect to the gate insulating film 106.

However, if the first sidewall (p-type gate electrode) 107a and the second sidewall (n-type gate electrode) 107b are formed using the chlorine $(Cl_2)$ gas, a height Hp of the p-type gate electrode of the PMOS transistor 110 differs from a height Hn of the n-type gate electrode of the NMOS transistor 111.

This is because the etching speed of the p-type poly-silicon film differs from that of the n-type poly-silicon film when the anisotropic dry etching is carried out using a gas containing chlorine. In other words, the removed amount of the n-type poly-silicon film is greater than that of the p-type poly-silicon film. For this reason, the second sidewall 107b is over-etched if the first sidewall 107a is etched until a height of the first sidewall 107a becomes a predetermined value. Accordingly, the final height Hn of the second sidewall (n-type gate electrode) 107b becomes smaller than the final height Hp of the first sidewall (p-type gate electrode) 107a.

If the dry etching is carried out using a fluorine gas, the selectivity of the silicon film (first and second sidewalls 107a and 107b) with respect to the gate insulating film 106 is lowered compared to when a chlorine gas is used.

Further, the dry etching with a chloride gas has to be carried out for a relatively long time to adjust the height of the first sidewall 107a. For this reason, portions of the gate insulating film, which cover the upper surface of the semiconductor substrate 101 around the first and second semiconductor pillars 105a and 105b, are also removed by the dry etching. Consequently, the upper surface (silicon surface) of the semiconductor substrate 101 is partially exposed. Therefore, the upper surface (silicon surface) of the semiconductor substrate 101 around the first and second semiconductor pillars 105a and 105b is likely to damage when the first and second sidewalls 107a and 107b are formed by etching with a fluorine containing gas. For this reason, desired characteristics of a transistor cannot be achieved.

The height of the gate electrode of the vertical MOS transistor corresponds to the gate length of the planar MOS transistor. Therefore, it is important to control the height of the gate electrode of the vertical MOS transistor. Regarding the manufacturing methods of the related art, however, it has been difficult to form the gate electrodes (first and second sidewalls 107a and 107b) of the PMOS and NMOS transistors 110 and 111 which have the same height. For this reason, it has been difficult to achieve desired characteristics of the transistors, such as the threshold voltage.

If the PMOS transistor 110 and the NMOS transistor 111 are formed at the same time and if the gate electrode (first sidewall 107a) of the PMOS transistor 110 is formed with an optimal height Hp, a height (gate length) Hn of the gate electrode (second sidewall 107b) of the second sidewall 107b becomes smaller than that of the height Hp. For this reason, it has been difficult to prevent the short channel effect and therefore to achieve desired characteristics of the transistor.

SUMMARY

In one embodiment, a method of manufacturing a semiconductor device may include, but is not limited to the following processes. A first insulating film is formed on a semiconductor substrate. The first insulating film has first and second portions. A part of the semiconductor substrate is removed by using the first insulating film as an etching mask to form first and second pillars of the semiconductor substrate. A second insulating film is formed on side surfaces of the first and second pillars. A silicon film is formed on the first insulating film and the second insulating film. The silicon film faces to the side surfaces of the first and second pillars with an intervention of the second insulating film therebetween. A first part of the silicon film is removed. The first part of the silicon film is located on upper surfaces of the first and second portions of the first insulating film. A coating film is formed over the semiconductor substrate. The coating film covers the upper surfaces of the first and second portions of the first insulating film. A part of the coating film is removed to expose the first insulating film and a second part of the silicon film. The second part of the silicon film is located on side surfaces of the first and second portions of the first insulating film. The second part of the silicon film is removed by dry etching.

In another embodiment, a method of manufacturing a semiconductor device may include, but is not limited to the following processes. A first insulating film is formed on a semiconductor substrate. The first insulating film has first and second portions. A part of the semiconductor substrate is removed by using the first insulating film as an etching mask to form first and second pillars of the semiconductor substrate. A second insulating film is formed on side surfaces of the first and second pillars. A silicon film is formed on the first insulating film and the second insulating film. The silicon film faces to the side surfaces of the first and second pillars with an intervention of the second insulating film therebetween. P-type impurity is introduced into the silicon film disposed over the side surface of the first pillar to form a p-type silicon film. N-type impurity is introduced into the silicon film disposed over the side surface of the second pillar to form an n-type silicon film. A first part of the silicon film is removed by dry etching using a gas including chlorine. The first part of the silicon film is located on upper surfaces of the first and second portions of the first insulating film. A coating film is formed over the semiconductor substrate. The coating film covers the upper surfaces of the first and second portions of the first insulating film. A part of the coating film is removed to expose the first insulating film and a second part of the silicon film. The second part of the silicon film is located on side surfaces of the first and second portions of the first insulating film. The second part of the silicon film is removed by dry etching using a gas including fluorine.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

First Embodiment

Figure 13:
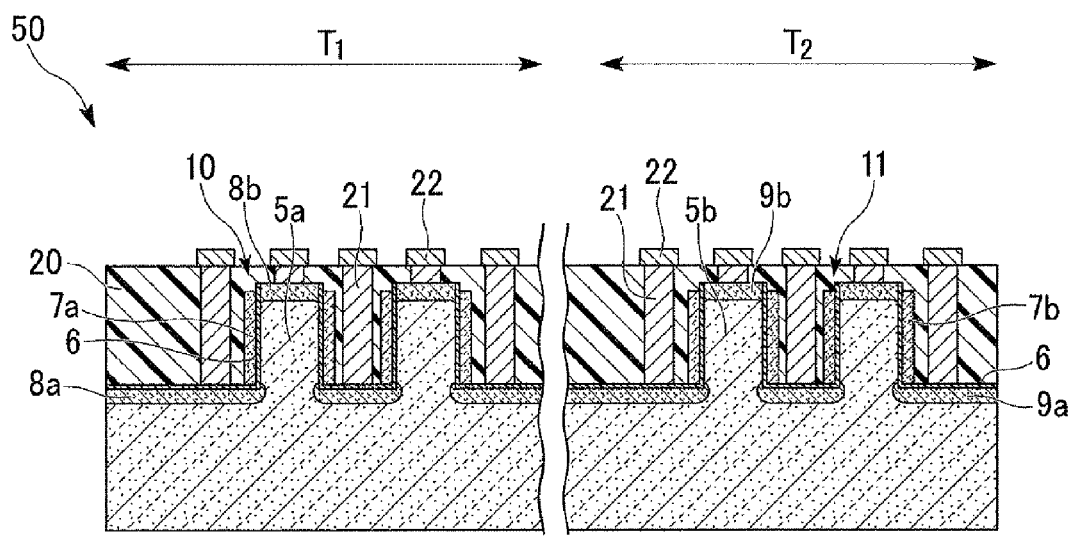

Hereinafter, a semiconductor device 50 according to a first embodiment of the present invention is explained with reference to FIG. 13. The semiconductor device 50 includes: a semiconductor substrate 1 (not shown); a first semiconductor pillar 5a in a first region T1; a second semiconductor pillar 5b in a second region T2; a first vertical MOS transistor (PMOS transistor) 10; a second vertical MOS transistor (NMOS transistor) 11; an inter-layer insulating film 20; a contact plug 21; and a metal wiring 22. The semiconductor substrate 1 (not shown) is made of silicon (Si). The semiconductor substrate 1 has the first region T1 and the second region T2 that is insulated from the first region T1 by an element isolation region. The semiconductor substrate 1 includes a first well 2 in the first region T1 and a second well 3 in the second region T2. An n-type impurity, such as phosphorus (P), is introduced into the first well 2. A p-type impurity, such as boron (B), is introduced into the second well 3.

The first semiconductor pillar 5a upwardly extends from a main surface of the semiconductor substrate 1 in the first region T1. The second semiconductor pillar 5b upwardly extends from the main surface of the semiconductor substrate 1 in the second region T2. Each of the first and second semiconductor pillars 5a and 5b has a height of, approximately 150 nm. Each of the first and second semiconductor pillars 5a and 5b is circular in plan view and has a diameter of approximately 100 nm. The shape of the first and second semiconductor pillars 5a and 5b is not limited to a circle, and may be an ellipse, a rectangle, and the like.

A gate insulating film 6, which is made of a silicon oxide film, covers the main surface of the semiconductor substrate 1 and side surfaces of the first and second semiconductor pillars 5a and 5b. The gate insulating film 6 has a thickness of approximately 5 nm The material forming the gate insulating film 6 is not limited to the silicon oxide film. Instead, a multi-layered film including a silicon oxide film and a silicon nitride film, a silicon oxynitride film (SiON), and the like may be used. Alternatively, a metal oxide film, such as a hafnium oxide film ($HfO_2$), a High-K film (high dielectric film), such as a silicate film such as a hafnium silicate nitride (HfSiON) film, and the like may be used as the gate insulating film 6.

The first vertical MOS transistor (PMOS transistor) 10 includes a first sidewall (silicon film) 7a and first and second p-type impurity diffusion layers 8a and 8b. The second vertical MOS transistor (NMOS transistor) 11 includes a second sidewall (silicon film) 7b and first and second n-type impurity diffusion layers 8b and 9b.

The first and second sidewalls 7a and 7b are made of a poly-silicon film having a thickness of, for example, 30 nm, and have the same height. In other words, the top level of the first sidewall 7a is equal to the top level of the second sidewall 7b. The top levels of the first and second sidewalls 7a and 7b are measured from the level of the upper surface of the gate insulating film 6. The first sidewall 7a covers the side surface of the first semiconductor pillar 5a. The second sidewall 7b covers the side surface of the second semiconductor pillar 5b.

A p-type impurity is introduced into the first sidewall 7a. An n-type impurity is introduced into the second sidewall 7b. Accordingly, the first sidewall 7a functions as a p-type gate electrode of the PMOS transistor 10. The second sidewall 7b functions as an n-type gate electrode of the NMOS transistor 11.

The first p-type impurity diffusion layer 8a is formed in the semiconductor substrate 1, adjacent to the main surface of the semiconductor substrate 1 and to the first semiconductor pillar 5a. The second p-type impurity diffusion layer 8b is formed in a top portion of the first semiconductor pillar 5a. For example, boron fluoride ($BF_2$) is introduced into the first and second p-type impurity diffusion layers 8a and 8b. The first and second p-type impurity diffusion layers 8a and 8b function as source and/or drain electrodes of the PMOS transistor 10.

The first n-type impurity diffusion layer 9a is formed in the semiconductor substrate 1, adjacent to the main surface of the semiconductor substrate 1 and to the second semiconductor pillar 5b. The second n-type impurity diffusion layer 9b is formed in the top portion of the second semiconductor pillar 5b. For example, arsenic (As) is introduced into the first and second n-type impurity diffusion layers 9a and 9b. The first and second n-type impurity diffusion layers 9a and 9b function as source and/or drain electrodes of the NMOS transistor 11.

The inter-layer insulating film 20 is made of a silicon oxide film or the like. The inter-layer insulating film 20 covers the PMOS transistor 10 and the NMOS transistor 11. Contact plugs 21, which are made of tungsten, poly-silicon, or the like, are connected to the first and second p-type impurity diffusion layers 8a and 8b, the first and second n-type impurity diffusion layers 9a and 9b, the p-type gate electrode 7a, and the n-type gate electrode 7b. Metal wirings 22, which are made of aluminum (Al), tungsten (W), copper (Cu), or the like, are connected to the contact plugs 21.

Hereinafter, a method of manufacturing the semiconductor device 50 according to the first embodiment is explained. The method of the first embodiment includes: a first process of forming the first and second semiconductor pillars 5a and 5b extending from the main surface of the semiconductor substrate 1; a second process of forming the gate insulating film 6; a third process of forming a silicon film 7; a fourth process of introducing impurities into the silicon film 7; a fifth process of forming the first and second sidewalls 7a and 7b; a sixth process of forming a flattening film 32; a seventh process of exposing top portions of the first and second sidewalls 7a and 7b; an eighth process of etching the first and second sidewalls 7a and 7b; a ninth process of removing the flattening film 32 and the first and second masks 4a and 4b; a tenth process of forming first and second impurity diffusion layers; an eleventh process of forming the PMOS and NMOS transistors 10 and 11; and a twelfth process of forming the inter-layer insulating film 20, the contact plugs 21, and the metal wirings 22. Hereinafter, each process is explained in detail.

Figure 1:
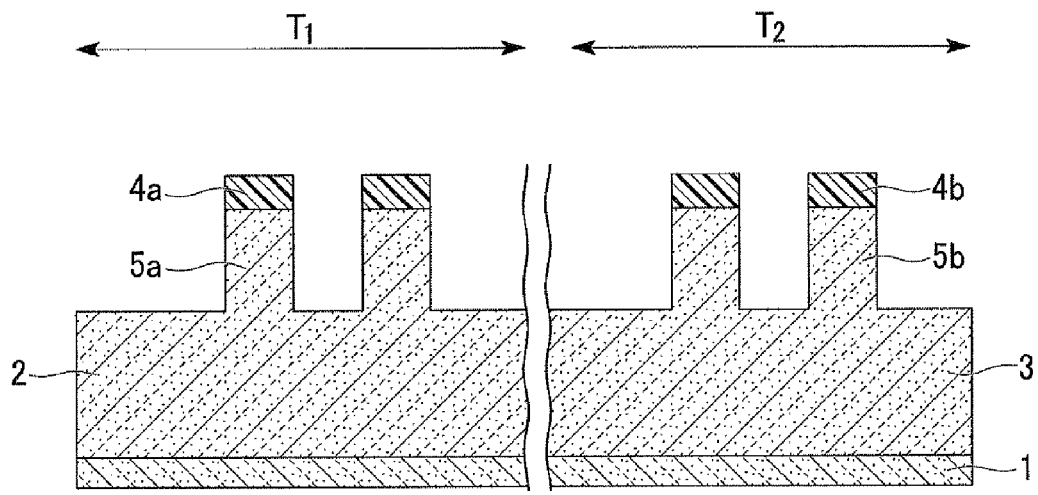
FIGS. 1 to 13 are cross-sectional views indicative of a process flow illustrating a method of manufacturing a semiconductor device according to a first embodiment of the present invention.

The first process is explained here with reference to FIG. 1. The first process includes: a process of forming the first and second wells 2 and 3; a process of forming the first and second masks (insulating films) 4a and 4b; and a process of forming the first and second semiconductor pillars 5a and 5b.

Firstly, the semiconductor substrate 1, which is made of silicon (Si), is prepared. Then, an element isolation region (not shown), which isolates the first and second regions T1 and T2 from each other, is formed using an STI (Shallow Trench Isolation) method. The first region T1 is a region in which the PMOS transistor 10 is to be formed in a later process. The second region T2 is a region in which the NMOS transistor 11 is to be formed in a later process.

Then, an n-type impurity, such as phosphorus (P), is introduced into the first region T1 of the semiconductor substrate 1 to form the first well 2. A p-type impurity, such as boron (B), is introduced into the second region T2 of the semiconductor substrate 1 to form the second well 3. Consequently, the first well 2 becomes the n-type, and the second well 3 becomes the p-type. An illustration of the semiconductor substrate 1 is omitted in FIGS. 2-13.

In the process of forming the first and second masks (insulating films) 4a and 4b, a mask (insulating film), which is made of a silicon nitride ($Si_3N_4$) film and the like, is formed over the semiconductor substrate 1. The mask has a thickness of approximately 80 μm. Alternatively, a silicon oxide ($SiO_2$) film may be formed over the semiconductor substrate 1a. Then, a silicon nitride film may be formed over the silicon oxide film.

Then, a photoresist film (not shown), which covers the mask (insulating film), is formed. Then, the mask is patterned by photolithography so as to form patterns of the first and second semiconductor pillars 5a and 5b, such as a circle, an ellipse, and a rectangle. In this embodiment, a pattern of the pillar, which is circular and has a diameter of approximately 100 nm in plan view, was formed. Thus, the first and second masks (insulating films) 4a and 4b are formed in the first and second regions T1 and T2, respectively.

In the process of forming the first and second semiconductor pillars 5a and 5b, the photoresist film is removed. Then, the semiconductor substrate 1 is etched using the first and second masks 4a and 4b. Thus, the first and second semiconductor pillars 5a and 5b, whose top surfaces are covered by the first and second masks 4a and 4b, are formed in the first and second regions T1 and T2, respectively.

In the second process, the gate insulating film 6, which is made of a silicon oxide film, is formed by thermal oxidation so as to cover the upper surface of the semiconductor substrate 1 and the side surfaces of the first and second semiconductor pillars 5a and 5b. The gate insulating film 6 has a thickness of approximately 5 nm. The material forming the gate insulating film 6 is not limited to the silicon oxide film. Instead, a multi-layered film including a silicon oxide film and a silicon nitride film, or a silicon oxynitride (SiON) film may be used. Alternatively, a metal film, such as a hafnium oxide ($HfO_2$) film, a High-K (high dielectric) film, such as a silicate film such as a hafnium silicate nitride (HfSiON) film, may be formed as the gate insulating film 6.

Figure 2:
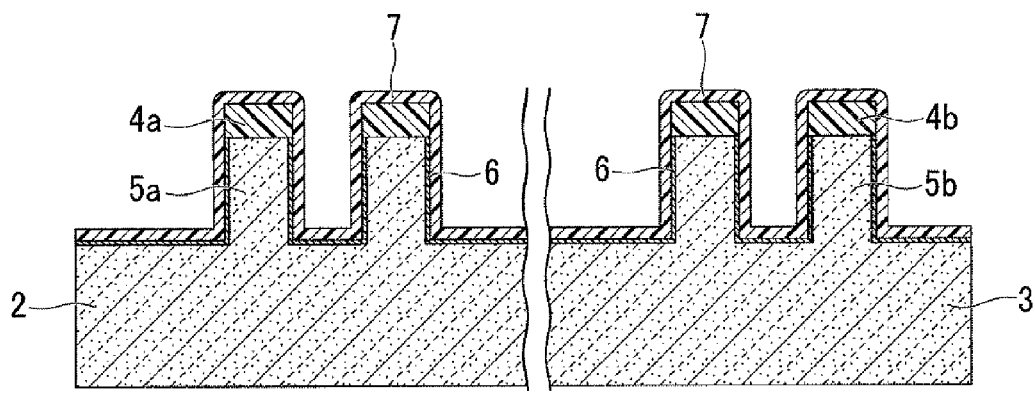

In the third process, the silicon film 7, which is made of poly-silicon and the like, is formed by CVD (Chemical Vapor Deposition), so as to cover the upper surface of the semiconductor substrate 1, the side surfaces of the first and second semiconductor pillars 5a and 5b, and the first and second masks 4a and 4b. The silicon film 7 has a thickness of approximately 30 nm In this case, a non-doped silicon film, into which no impurity is introduced, is formed as the silicon film 7. Thus, the silicon film 7 is formed as shown in FIG. 2.

Figure 3:
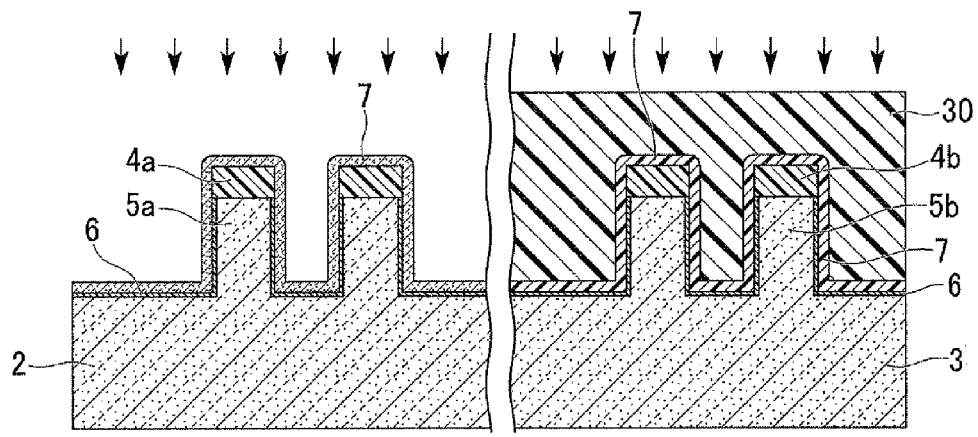

In the fourth process, a first photoresist film 30 is formed so as to cover a second portion of the silicon film 7 in the second region T2 and to expose a first portion of the silicon film 7 in the first region T1. Then, a p-type impurity is introduced into the first portion of the silicon film 7 in the first region T1 while the first photoresist film 30 masks the second portion of the silicon film 7 in the second region T2. Specifically, boron (B) is ion-implanted at an energy of 5 KeV, at a dose amount of $2\times10^{15}$ atoms/$cm^2$. After the ion implantation of the p-type impurity, the first photoresist film 30 is removed. Thus, the p-type impurity is introduced into the first portion of the silicon film 7 in the first region T1, as shown in FIG. 3.

Figure 4:
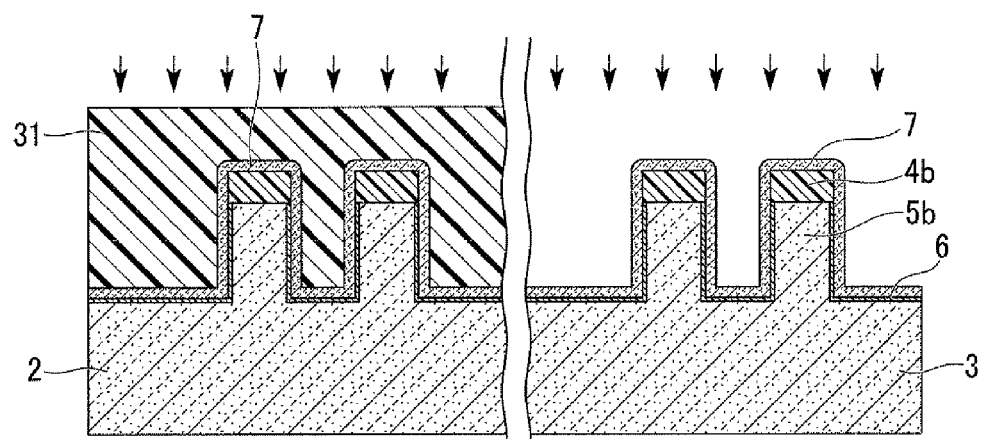

Then, an n-type impurity is introduced into the second portion of the silicon film 7 in the second region T2, as shown in FIG. 4. Firstly, a second photoresist film 31 is formed so as to cover the first portion of the silicon film 7 in the first region T1 and to expose the second portion of the silicon film 7 in the second region T2.

Then, an n-type impurity is introduced into the second portion of the silicon film 7 in the second region T2 while the second photoresist film 31 masks the first portion of the silicon film 7 in the first region T1. Specifically, phosphorus (P) is ion-implanted at an energy of 10 KeV, at a dose amount of $2\times10^{15}$ atoms/$cm^2$. After the ion implantation of the n-type impurity, the second photoresist film 31 is removed. Thus, the p-type impurity is introduced into the first portion of the silicon film 7 in the first region T1. The n-type impurity is introduced into the second portion of the silicon film 7 in the second region T2.

Figure 5:
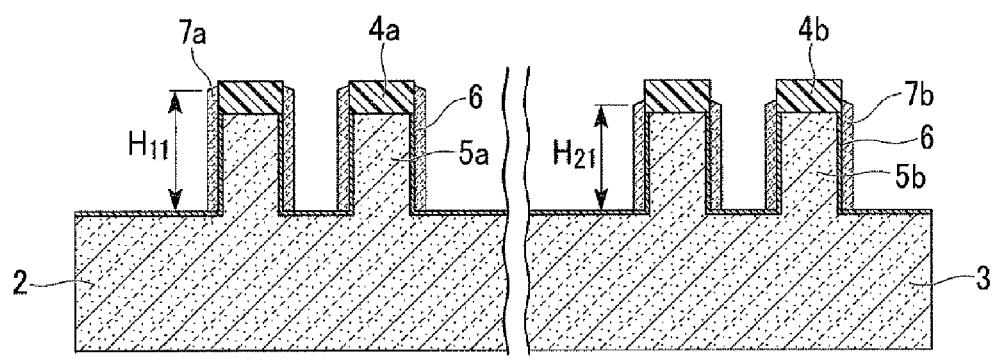

In the fifth process, portions of the silicon film 7, which cover the upper surfaces of the semiconductor substrate 1 and the first and second masks 4a and 4b, are etched with a high etching selectivity of the silicon film 7 with respect to the gate insulating film 6, as shown in FIG. 5. Specifically, the silicon film 7 is subjected to an RTA (Rapid Thermal Annealing) process. For example, the annealing process is carried out in a nitrogen atmosphere, at a temperature of 900° C., for 30 seconds. This thermal treatment may be carried out according to need. Thus, the impurities introduced into the silicon film 7 diffuse, thereby enabling uniform etching of the silicon film 7 in a later process. If there is no problem on uniformity of etching, the thermal treatment is not necessary.

Then, anisotropic dry etching is carried out. Thus, the portions of the silicon film 7, which cover the upper surfaces of the semiconductor substrate 1 and the first and second masks 4a and 4b, are removed. In this case, the anisotropic dry etching is preferably carried out with a high selectivity of the silicon film 7 with respect to the gate insulating film 6. Additionally, a gas containing chlorine, such as a chlorine ($Cl_2$) gas and a hydrogen bromide (HBr) gas, may be used for the anisotropic dry etching.

When the dry etching is carried out using such a gas containing chlorine, the etching rate of the p-type silicon film (the first portion of the silicon film 7 in the first region T1) differs from that of the n-type silicon film (the second portion of the silicon film 7 in the second region T2).

The etching condition in this process of the first embodiment does not differ from the etching condition of the related art. The difference from the related art is that the etching process is stopped before the height of the first silicon sidewall 7a becomes a predetermined value. In the first embodiment, the etching process is stopped when the portion of the silicon film 7, which covers the upper surface of the first mask 4a in the first region T1, is removed. Thus, the first silicon sidewall 7a covers not only the side surface of the semiconductor pillar 5a, but also the side surface of the first mask 4a. In this case, the difference in height between the first and second sidewalls 7a and 7b is reduced compared to the case of the related art.

Since the dry etching process is carried out using the gas containing chlorine, the silicon film 7 can be selectively etched with a high selectivity with respect to the gate insulating film 6. Therefore, the silicon film 7 can be removed without causing damage to the first and second semiconductor pillars 5a and 5b and the main surface (silicon surface) of the semiconductor substrate 1.

Consequently, the first sidewall (p-type silicon film) 7a, which covers the side surfaces of the first semiconductor pillar 5a and the first mask 4a, is formed. Additionally, the second sidewall (n-type silicon film) 7b, which covers the side surfaces of the second semiconductor pillar 5b and the second mask 4b, is formed. In this case, the height H11 of the first sidewall 7a is greater than the height H21 of the second sidewall 7b.

In the sixth process, a flattening film 32, which is made of a coating film, such as a BARC (Bottom Anti-Reflective Coating), is formed by spinning technique so as to cover the gate insulating film 6, the first and second sidewalls 7a and 7b, and the first and second masks 4a and 4b. The flattening film 32 has a thickness of approximately 400 nm.

As the material forming the flattening film 32, a material, which has a lower selectivity with respect to the first and second sidewalls 7a and 7b when a fluorine containing gas is used as an etching gas. The material is not limited to a coating film, such as the BARC. Instead, an organic material, such as a photoresist film, may be used. Alternatively, a multi-layered film including multiple organic material films may be used. Additionally, the thickness of the flattening film 32 is not limited to approximately 400 nm. Any thickness may be used as long as the flattening film 32 fills a space between the first and second semiconductor pillars 5a and 5b and covers the upper surfaces of the first and second masks 4a and 4b.

Figure 7:
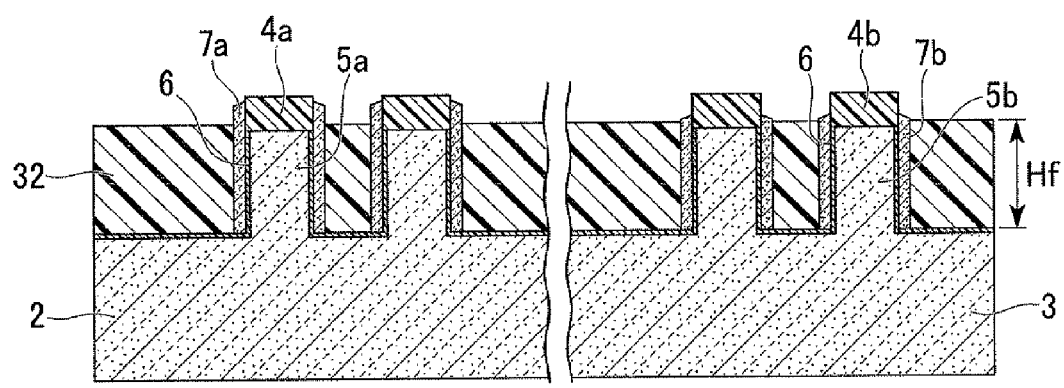

In the seventh process, a dry etching is carried out with a gas containing oxygen ($O_2$) to selectively remove the flattening film 32. In this case, the dry etching is stopped when a thickness of the flattening film 32 becomes a predetermined value Hf. The thickness Hf is set to a value that is a slightly smaller than the height H21 of the second sidewall 7b. Thus, top portions of the first and second masks 4a and 4b, and top portions of the first and second sidewalls 7a and 7b are exposed, as shown in FIG. 7.

The dry etching is carried out with a high etching selectivity of the flattening film 32 with respect to the first and second masks 4a and 4b and the first and second sidewalls 7a and 7b. Consequently, the first and second masks 4a and 4b, and the first and second sidewalls 7a and 7b are hardly etched, and only the flattening film 32 is etched.

In the eighth process, the flattening film 32 and the first and second sidewalls 7a and 7b are etched with a high selectivity of the first and second sidewalls 7a and 7b with respect to the flattening film 32. Specifically, the exposed portions of the first and second sidewalls 7a and 7b and the flattening film 32 are etched using a fluorine containing gas. For example, a $CF_4$ gas, an $SF_6$ gas, an $NF_3$ gas, or the like may be used as the fluorine gas.

Consequently, the first and second sidewalls 7a and 7b can be etched at substantially the same etching speed since the difference in the conductive type (n-type and p-type) does not affect the etching speed.

When the etching using a fluorine gas is carried out, generally, the etching rate of the silicon film is greater than that of an organic resin film, such as the flattening film 32. However, the first and second sidewalls 7a and 7b are formed as a silicon film in the first embodiment, and extend from the upper surface of the flattening film 32. For this reason, the flattening film 32 is etched while the etched surface of the flattening film 32 is kept flat. Accordingly, portions of the first and second sidewalls 7a and 7b, which are covered by the flattening film 32, are not etched. Therefore, the etching proceeds while the top levels of the first and second sidewalls 7a and 7b are substantially equal to the top level of the flattening film 32.

At the first stage of the etching process, the silicon film (the first and second sidewalls 7a and 7b) is etched faster than the flattening film 32. Then, the top level of the n-type silicon film (second sidewall 7b) becomes substantially equal to the top level of the flattening film 32.

Then, the upper surface of the second sidewall 7b becomes lower in level than the upper surface of the flattening film 32. Thus, a recess is formed at a removed portion of the second sidewall 7b, which is defined by a side surface of the flattening film 32, an etched upper surface of the second sidewall 7b, and the side surface of the gate insulating film 6.

A carbon reaction product, which is generated by etching the flattening film 32, fills the recess. For this reason, the etching of the upper surface of the second sidewall 7b is gradually slowed. Consequently, the upper surface of the second sidewall 7b is prevented from being further etched and therefore being lowered in level than the upper surface of the flattening film 32.

Similarly, when the upper surface of the p-type silicon film (the first sidewall 7a) becomes lower in level than the upper surface of the flattening film 32, the upper surface of the first sidewall 7a is prevented from being further etched and therefore lowered in level. Consequently, the top level of the flattening film 32 is kept substantially equal to the top levels of the first and second sidewalls 7a and 7b during the etching process.

Further, the flattening film 32 and the reaction products in the recesses are gradually removed by the etching process. For this reason, the thickness of the flattening film 32 is reduced, and then upper portions of the first and second sidewalls 7a and 7b become exposed again.

In this repetitive manner, the first and second sidewalls 7a and 7b can be lowered in level by the etching process while the top levels of the first and second sidewalls 7a and 7b are kept substantially equal to the top level of the flattening film 32. Accordingly, the final height H12 of the first sidewall 7a becomes substantially equal to the final height H22 of the second sidewall 7b.

The gate insulating film 6 and the main surface of the semiconductor substrate 1 are not etched since these elements are covered by the flattening film 32, thereby preventing portions of the main surface (silicon surface) of the semiconductor substrate 1, which are adjacent to the first and second semiconductor pillars 5a and 5b, from being damaged.

The gate insulating film 6 covers the side surfaces of the first and second semiconductor pillars 5a and 5b even after the top portions of the first and second sidewalls 7a and 7b are removed by the etching process. This is because a period of time from when the gate insulating film 6 is partially exposed to when the etching process ends (i.e., a time for which the gate insulating film 6 is subjected to the etching process) is short. Accordingly, the semiconductor surface of the first and second semiconductor pillars 5a and 5b can be prevented from being damaged.

In the ninth process, the flattening film 32 is removed by an ashing process. After the flattening film 32 is removed, a process of causing a high melting point metal film to be silicided with the first and second sidewalls 7a and 7b may be added according to need. As the high melting point metal film, a cobalt (Co) film, a tungsten (W) film, a titanium (Ti) film, a nickel (Ni) film, and the like may be used. Accordingly, electric resistance of the first and second sidewalls 7a and 7b can be reduced.

Figure 9:
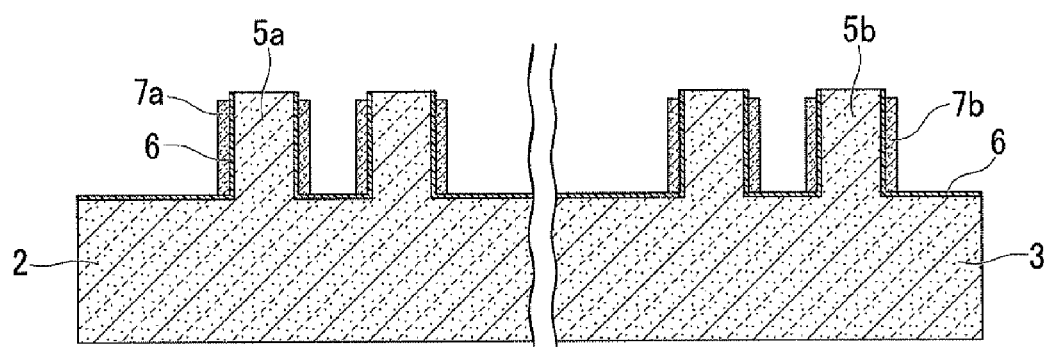

Then, the first and second masks 4a and 4b are removed as shown in FIG. 9. When the first and second masks 4a and 4b are made of a silicon nitride film, the first and second masks 4a and 4b are removed by a wet etching process using heated phosphoric acid.

Figure 10:
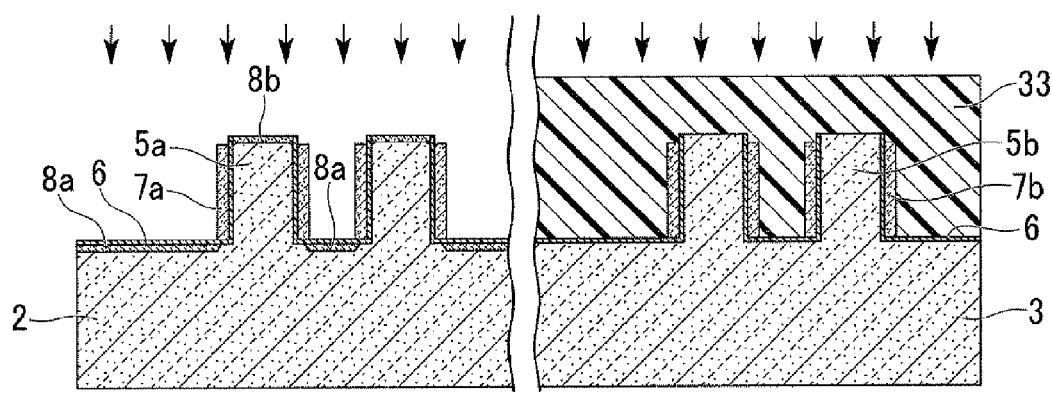

In the tenth process, the first and second p-type impurity diffusion layers 8a and 8b are formed first, as shown in FIG. 10. Firstly, a photoresist film (not shown) is formed so as to cover the gate insulating film 6, the side surfaces of the first and second sidewalls 7a and 7b, and the upper surfaces of the first and second semiconductor pillars 5a and 5b. Then, the photoresist film in the first region T1 is removed. Thus, a third photoresist film 33, which covers only the second region T2, is formed as a mask pattern.

Then, a p-type impurity is introduced into the semiconductor substrate 1 and the top portion of the first semiconductor pillar 5a in the first region T1. Specifically, boron fluoride ($BF_2$) is ion-implanted at an energy of 10 KeV, at a dose amount of $1 \times 10^{15}$ atoms/$cm^2$. Thus, the first p-type impurity diffusion layer 8a is formed adjacent to the main surface of the semiconductor substrate 1 and to the first semiconductor pillar 5a. The second p-type impurity diffusion layer 8b is formed in the top portion of the first semiconductor pillar 5a. The first and second p-type impurity diffusion layers 8a and 8b function as source and/or drain electrodes of the PMOS transistor 10 as will be explained later. After the ion implantation, the third photoresist film 33 is removed.

Figure 11:
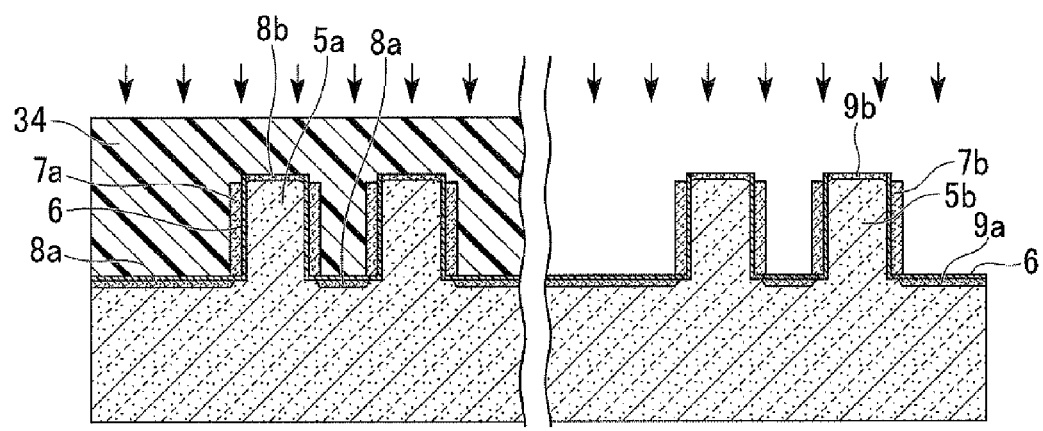

Then, the first and second n-type impurity diffusion layers 9a and 9b are formed as shown in FIG. 11. Firstly, a photoresist film (not shown) is formed so as to cover the gate insulating film 6, the side surfaces of the first and second sidewalls 7a and 7b, and the upper surfaces of the first and second semiconductor pillars 5a and 5b. Then, the photoresist film in the first region T2 is removed. Thus, a fourth photoresist film 34, which covers only the first region T1, is formed as a mask pattern.

Then, an n-type impurity is introduced into the semiconductor substrate 1 and the top portion of the second semiconductor pillar 5b in the second region T2. Specifically, arsenic (As) is ion-implanted at an energy of 10 KeV, at a dose amount of $1 \times 10^{15}$ atoms/cm$^2$. Thus, the first n-type impurity diffusion layer 9a is formed adjacent to the main surface of the semiconductor substrate 1 and to the second semiconductor pillar 5b. The second n-type impurity diffusion layer 9b is formed in the top portion of the second semiconductor pillar 5b. The first and second n-type impurity diffusion layers 9a and 9b function as source and/or drain electrodes of the NMOS transistor 11 as will be explained later. After the ion implantation, the fourth photoresist film 34 is removed.

Figure 12:
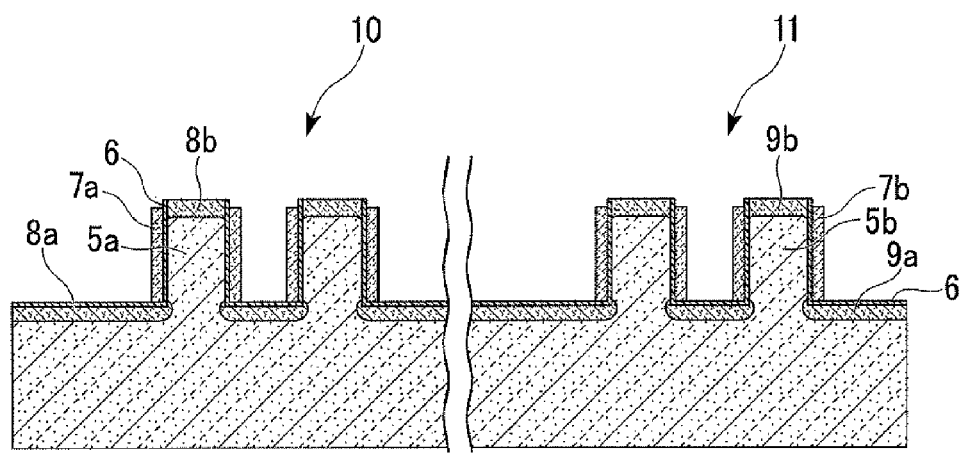

In the eleventh process, a thermal treatment is carried out to activate the p-type impurity diffusion layers 8a and 8b and the n-type impurity diffusion layers 9a and 9b. Specifically, an annealing process is carried out by the RTA method in a nitrogen atmosphere, at a temperature of 1000° C., for 10 seconds. Thus, the PMOS transistor 10 and the NMOS transistor 11 are formed in the first and second regions T1 and T2, respectively, as shown in FIG. 12. The PMOS transistor 10 includes the p-type impurity diffusion layers 8a and 8b as the source and/or drain, and the p-type sidewall 7a as the gate electrode. The NMOS transistor 11 includes the n-type impurity diffusion layers 9a and 9b as the source and/or drain, and the n-type sidewall 7b as the gate electrode. The first and second sidewalls 7a and 7b have substantially the same height.

In the twelfth process, the inter-layer insulating film 20, the contact plugs 21, and the metal wirings 22 are formed. Firstly, the inter-layer insulating film 20, which is made of a silicon oxide film and the like, is formed so as to cover the PMOS and NMOS transistors 10 and 11. Then, the contact plugs 21, which are made of tungsten, poly-silicon, or the like, are formed so as to be connected to the sources and/or drains (the p-type impurity diffusion layers 8a and 8b and the n-type impurity diffusion layers 9a and 9b) and the gate electrodes (the p-type and n-type sidewalls 7a and 7b).

Then, the metal wirings 22, which are made of aluminum (Al), tungsten (W), copper (Cu), and the like, are formed to be connected to the contact plugs 21. After the metal wirings 22 are formed, another upper wiring layer, a surface protection film, and the like may be formed according to need. Thus, the semiconductor device of the first embodiment is complete.

According to the manufacturing method of the first embodiment, the p-type gate electrode of the PMOS transistor 10 and the n-type gate electrode of the NMOS transistor 11, which have the same height, can be formed by the same process. Accordingly, desired characteristics of the transistors, such as the threshold voltage, can be achieved. Additionally, the short channel effect can be prevented.

Additionally, the first and second sidewalls 7a and 7b are removed while the flattening film 32 covers the main surface of the semiconductor substrate 1. Accordingly, the p-type gate electrode (first sidewall 7a) and the n-type gate electrode (second sidewall 7b) can be formed while the gate insulating film 6 covers the side surfaces of the first and second semiconductor pillars 5a and 5b, without damaging the main surface of the semiconductor substrate 1. Therefore, the desired characteristics of the transistors can be achieved.

Although the case where the vertical transistors are formed has been explained as the first embodiment, a memory element may be formed so as to be connected to the source and/or drain electrode. As the memory element, a capacitor element, a phase change element, a resistance variable element, and the like may be used. Thus, a memory cell of a memory device can be formed.

Second Embodiment

Hereinafter, a semiconductor device 50 according to a second embodiment of the present invention is explained. The like reference numerals denote like elements between the first and second embodiments. The semiconductor device 50 includes: the semiconductor substrate 1; the first and second semiconductor pillars 5a and 5b; first and second vertical MOS transistors (both of which are the NMOS transistors 11); the inter-layer insulating film 20; the contact plugs 21; and the metal wirings 22.

The second embodiment differs from the first embodiment in that the same impurity is diffused into the first and second semiconductor pillars 5a and 5b, and that both the first and second vertical MOS transistors are the NMOS transistor 11. Hereinafter, only the difference from the first embodiment is explained.

A p-type impurity, such as boron (B), is introduced into the semiconductor substrate 1. Both the first well 2 in the first region T1 and the second well 3 in the second region T2 are p-type. The first and second semiconductor pillars 5a and 5b are formed in the first and second regions T1 and T2, respectively.

Both the first and second vertical MOS transistors are the NMOS transistor 11. The first vertical MOS transistor includes first and second n-type impurity diffusion layers 18a and 18b. The second vertical MOS transistor includes the first and second n-type impurity diffusion layers 9a and 9b. The first n-type impurity diffusion region 18a is positioned adjacent to the main surface of the semiconductor substrate 1 and to the bottom portion of the first semiconductor pillar 5a. The second n-type impurity diffusion region 18b is positioned in the top portion of the first semiconductor pillar 5a.

The first n-type impurity diffusion region 9a is positioned adjacent to the main surface of the semiconductor substrate 1 and to the bottom portion of the second semiconductor pillar 5b. The second n-type impurity diffusion region 9b is positioned in the top portion of the second semiconductor pillar 5b. For example, arsenic (As) is introduced into all of the impurity diffusion layers 9a, 9b, 18a, and 18b. These impurity diffusion layers 9a, 9b, 18a, and 18b function as source and/or drain electrodes.

Hereinafter, a method of manufacturing the semiconductor device 50 according to the second embodiment is explained. The method of the second embodiment includes: a first process of forming the first and second semiconductor pillars 5a and 5b extending from the main surface of the semiconductor substrate 1; a second process of forming the gate insulating film 6; a third process of forming a silicon film 7; a fourth process of introducing impurities into the silicon film 7; a fifth process of forming the sidewalls 7a and 7b; a sixth process of forming the flattening film 32; a seventh process of exposing top portions of the sidewalls 7a and 7b; an eighth process of etching the sidewalls 7a and 7b; a ninth process of removing the flattening film 32 and the masks 4a and 4b; a tenth process of forming the impurity diffusion layers 9a, 9b, 18a, and 18b; an eleventh process of forming the NMOS transistors 11; and a twelfth process of forming the inter-layer insulating film 20, the contact plugs 21, and the metal wirings 22. Hereinafter, only the difference from the method of the first embodiment is explained.

The first process includes: a process of forming the first and second wells 2 and 3; a process of forming the first and second masks (insulating films) 4a and 4b; and a process of forming the first and second semiconductor pillars 5a and 5b.

Firstly, the semiconductor substrate 1 is prepared. Then, the first and second regions T1 and T2 are isolated from each other. Then, a p-type impurity, such as boron (B), is introduced into the first regions T1 and T2 of the semiconductor substrate 1 to form the first and second wells 2 and 3 in the first and second regions T1 and T2, respectively. Both the first and second wells 2 and 3 are p-type. The second to ninth processes are the same as those of the first embodiment. Therefore, explanations thereof are omitted here.

Figure 14:
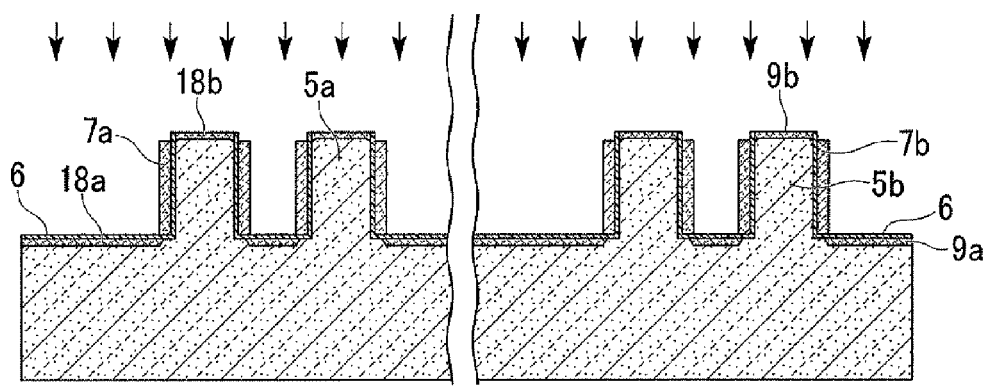
FIGS. 14 to 15 are cross-sectional views indicative of a process flow illustrating a method of manufacturing a semiconductor device according to a second embodiment of the present invention.
Figure 15:
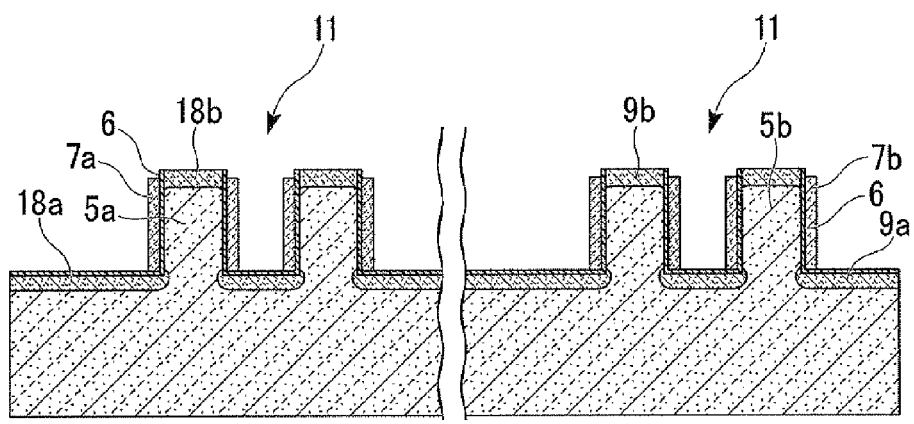
Figure 16:
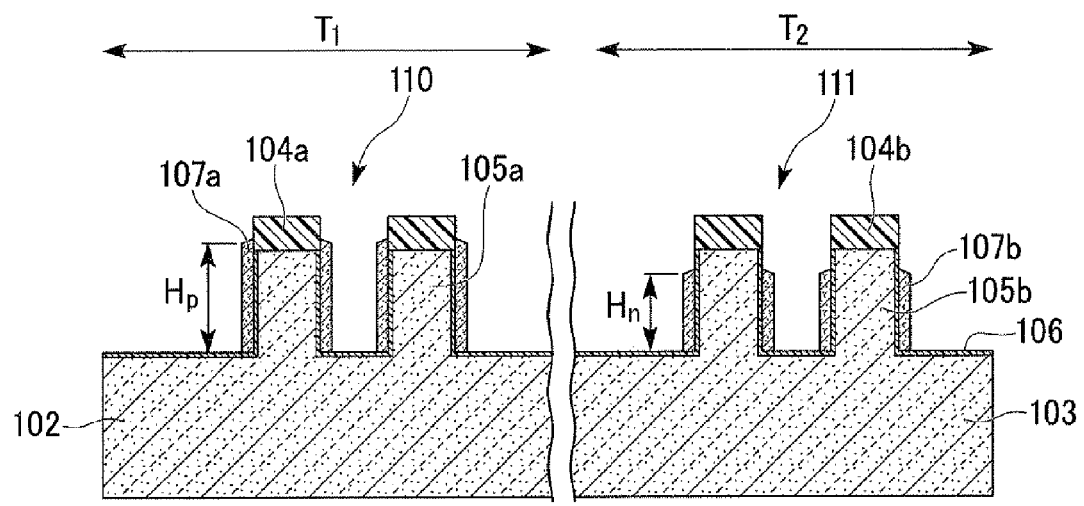
FIG. 16 is a cross-sectional view illustrating a method of manufacturing a semiconductor device according to a related art.

In the tenth process, the n-type impurity diffusion layers 9a, 9b, 18a, and 18b are formed as shown in FIG. 14. The difference from the first embodiment is that the n-type impurity diffusion layers 18a and 18b are formed instead of the p-type impurity diffusion layers 8a and 8b. Hereinafter, only the difference from second embodiment is explained.

Firstly, an n-type impurity is introduced into the first and second regions T1 and T2 of the semiconductor substrate 1 and the top portions of the first and second semiconductor pillars 5a and 5b. In this case, the fourth photoresist film 34 is not formed as explained in the first embodiment. Instead, the first and second regions T1 and T2 are exposed.

Specifically, arsenic (As) is ion-implanted into the semiconductor substrate 1 at an energy of 10 KeV, at a dose amount of $1\times10^{15}$ atoms/cm$^2$. Thus, the first n-type impurity diffusion layers 18a and 9a are formed in the first and second regions T1 and T2, respectively. The first n-type impurity diffusion layers 18a and 9a are adjacent to the main surface of the semiconductor substrate 1. Additionally, the second n-type impurity diffusion layers 18b and 9b are formed in the top portions of the first and second semiconductor pillars 5a and 5b, respectively. The n-type impurity diffusion layers 9a, 9b, 18a, and 18b function as source and/or drain electrodes.

In the eleventh process, a thermal treatment is carried out to activate the n-type impurity diffusion layers 9a, 9b, 18a, and 18b. The following twelfth process is the same as that of the first embodiment. Therefore, an explanation thereof is omitted here.

According to the manufacturing method of the second embodiment, similar to the first embodiment, the p-type gate electrode (first sidewall 7a) and the n-type gate electrode (second sidewall 7b), which have substantially the same height, can be formed by the same process. Additionally, the same impurity is diffused into the first and second regions T1 and T2. Accordingly, the two NMOS transistors 11 including the different-conductive-type gate electrodes can be formed in the first and second regions T1 and T2. Specifically, the NMOS transistor 11 in the first region T1 includes the p-type gate electrode (first sidewall 7a). The NMOS transistor 11 in the second region T2 includes the n-type gate electrode (second sidewall 7b).

Further, if n-type wells 2 and 3 and p-type impurity diffusion layers are formed in the first and second regions T1 and T2 in a similar manner as the method of the second embodiment, two PMOS transistors 10 including different-conductive-type gate electrodes can be formed in the first and second regions T1 and T2. Specifically, the PMOS transistor 10 in the first region T1 includes the p-type gate electrode (first sidewall 7a). The PMOS transistor 10 in the second region T2 includes the n-type gate electrode (second sidewall 7b).

Moreover, the conductive type of the vertical MOS transistor (PMOS transistor 10 or the NMOS transistor 11) and the conductive type of the gate electrode (first or second sidewall 7a or 7b) can be combined freely, thereby achieving the optimal electric characteristics of transistors (such as the threshold voltage). Accordingly, the electric characteristics of each vertical MOS transistor can be easily adjusted, thereby enabling a fabrication of the high performance semiconductor device 50.

EXAMPLE

Hereinafter, a first example of the present invention is explained. The present invention is not limited to the first example, and various modifications can be made without departing from the scope of the present invention.

Firstly, the semiconductor substrate 1, which was made of silicon (Si), was prepared. Then, an element isolation region (not shown) was formed by the STI method to isolate the first and second regions T1 and T2 from each other. Then, an n-type impurity, such as phosphorus (P), was introduced into the first region T1 of the semiconductor substrate 1 to form the first well 2. A p-type impurity, such as boron (B), was introduced into the second region T2 of the semiconductor substrate 1 to form the second well 3.

Then, a mask (not shown), which was made of a silicon nitride ($Si_3N_4$) film, was formed over the semiconductor substrate 1. The mask had a thickness of approximately 80 μm. Then, a photoresist film covering the mask was formed. Then, the mask was patterned into a circular pattern having a diameter of approximately 100 nm in plan view. Thus, the first and second masks 4a and 4b were formed.

Then, the photoresist film was removed. Then, the semiconductor substrate 1 was etched by approximately 150 nm in depth, using the first and second masks 4a and 4b. Thus, the first and second semiconductor pillars 5a and 5b were formed, as shown in FIG. 1.

Then, the gate insulating film 6, which was made of a silicon oxide film, was formed so as to cover the main surface of the semiconductor substrate 1, and the side surfaces of the first and second semiconductor pillars 5a and 5b. The gate insulating film 6 had a thickness of approximately 5 nm Then, the non-doped silicon film 7, which had a thickness of approximately 30 nm, was formed so as to cover the side surfaces of the first and second semiconductor pillars 5a and 5b, and the first and second masks 4a and 4b, as shown in FIG. 2.

Then, a p-type impurity was introduced into the silicon film 7 in the first region T1 using the first photoresist film 30 as a mask, as shown in FIG. 3. Specifically, boron (B) was ion-implanted at an energy of 5 KeV, at a dose amount of $2\times10^{15}$ atoms/cm$^2$.

Then, an n-type impurity was introduced into the silicon film 7 in the second region T2 using the second photoresist film 31 as a mask, as shown in FIG. 4. Specifically, phosphorus (P) was ion-implanted at an energy of 10 KeV, at a dose amount of $2\times10^{15}$ atoms/cm$^2$.

Then, the silicon film 7 was subjected to an annealing process using the RTA method in a nitrogen atmosphere, at a temperature of 900° C., for 30 seconds. Then, an anisotropic dry etching was carried out to remove portions of the silicon film 7, which covers the upper portions of the first and second masks 4a and 4b, and the main surface of the semiconductor substrate 1.

Specifically, the anisotropic dry etching was carried out using an ICP (Inductively Coupled Plasma) etching apparatus, at a flow ratio of $Cl_2$/HBr=30/15 sccm, at an ICP source power of 300 W, at a bias power of 75 W, at a pressure of 6 mTorr.

The etching rate of the silicon film 7 was examined under the above etching conditions. The etching rate of the p-type silicon film containing boron was approximately 85 nm/min. The etching rate of the n-type silicon film containing phosphorus was approximately 110 nm/min. The etching rate of the n-type silicon film was faster than that of the p-type silicon film. For this reason, the height H11 of the first sidewall 7a was approximately 220 nm. The height H21 of the second sidewall 7b was approximately 200 nm. Thus, a height difference occurred as shown in FIG. 5.

Figure 6:
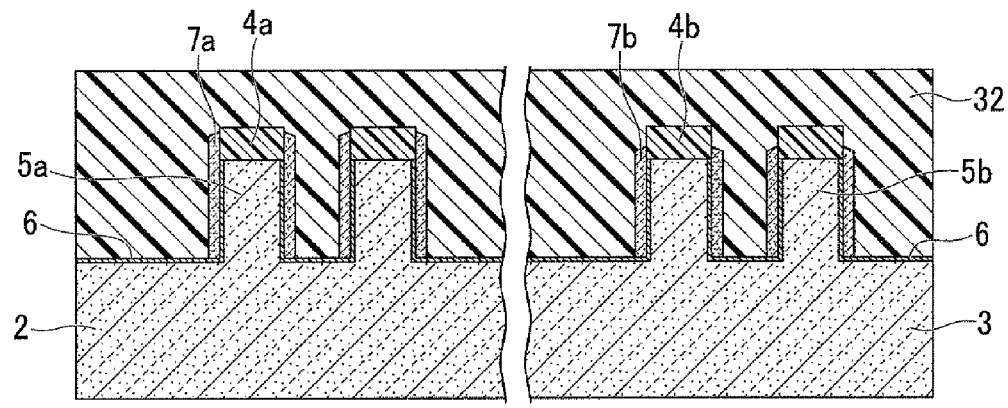

Then, the flattening film 32, which was made of a coating film, such as the BARC, was formed by the spinning method so as to cover the gate insulating film 6, the first and second sidewalls 7a and 7b, and the first and second masks 4a and 4b, as shown in FIG. 6. The flattening film 32 had a thickness of approximately 400 nm.

Then, the flattening film 32 was selectively removed by the dry etching process using a gas containing oxygen ($O_2$). The dry etching process was stopped when the thickness of the flattening film 32 became the predetermined value Hf. Thus, top portions of the first and second masks 4a and 4b, and the first and second sidewalls 7a and 7b were exposed, as shown in FIG. 7.

Specifically, the dry etching process was carried out using the ICP etching apparatus, at an $O_2$ flow rate of 800 sccm, at a source power of 600 W, at a bias power of 50 W, at a pressure of 25 mTorr.

Figure 8:
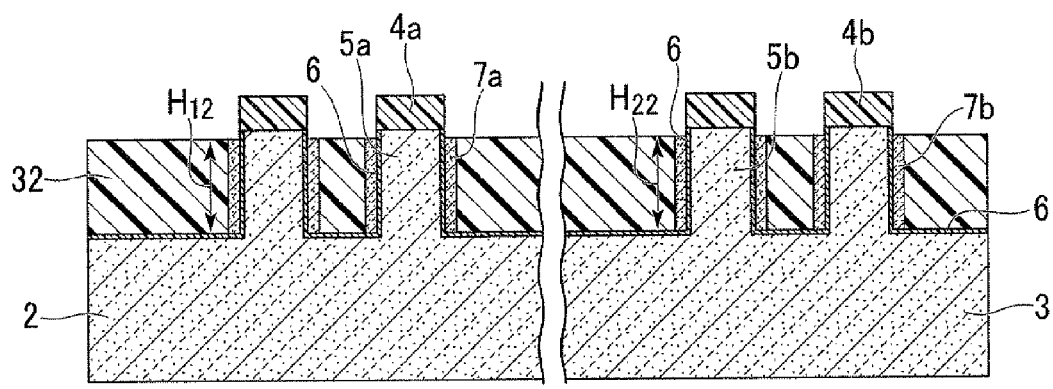

Then, the exposed portions of the first and second sidewalls 7a and 7b, and the flattening film 32 were etched using a fluorine containing gas. Thus, the first and second sidewalls 7a and 7b were removed at substantially the same etching speed, as shown in FIG. 8.

Specifically, the etching process was carried out using the ICP etching apparatus, at a $CF_4$ flow rate of 100 sccm, at a source power of 300 W, at a bias power of 100 W, at a pressure of 4 mTorr.

Then, the flattening film 32 was removed by an ashing process using an oxygen containing gas. Then, the first and second masks 4a and 4b were removed by a wet etching process using heated phosphoric acid, as shown in FIG. 9.

Then, an impurity was introduced into the first region T1 of the semiconductor substrate 1 and the top portion of the first semiconductor pillar 5a using the third photoresist film 33 as a mask. Specifically, boron fluoride ($BF_2$) was ion-implanted at an energy of 10 KeV, at a dose amount of $1\times10^{15}$ atoms/ $cm^2$. Thus, the first p-type impurity diffusion layer 8a was formed adjacent to the main surface of the semiconductor substrate 1. Additionally, the second p-type impurity diffusion layer 8b was formed in the top portion of the first semiconductor pillar 5a, as shown in FIG. 10.

Then, an impurity was introduced into the second region T2 of the semiconductor substrate 1 and the top portion of the second semiconductor pillar 5b using the fourth photoresist film 34 as a mask. Specifically, arsenic (As) was ion-implanted at an energy of 10 KeV, at a dose amount of $1\times10^{15}$ atoms/$cm^2$. Thus, the first n-type impurity diffusion layer 9a was formed adjacent to the main surface of the semiconductor substrate 1. Additionally, the second n-type impurity diffusion layer 9b was formed in the top portion of the second semiconductor pillar 5b, as shown in FIG. 11.

Then, an annealing process was carried out using the rapid thermal treatment, in a nitrogen atmosphere, at a temperature of 1000° C., for 10 seconds. Thus, the PMOS transistor 10 and the NMOS transistor 11 were formed in the first and second regions T1 and T2, respectively, as shown in FIG. 12. Then, the inter-layer insulating film 20, the contact plugs 21, and the metal wiring 22 were formed. Thus, the semiconductor device 50 was formed as shown in FIG. 13.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, and may be modified and changed without departing from the scope and spirit of the invention.

What is claimed is:

1. A method of manufacturing a semiconductor device, comprising:
   forming a first insulating film on a semiconductor substrate, the first insulating film having first and second portions;
   removing a part of the semiconductor substrate by using the first insulating film as an etching mask to form first and second pillars of the semiconductor substrate;
   forming a second insulating film on side surfaces of the first and second pillars;
   forming a silicon film on the first insulating film and the second insulating film, the silicon film facing to the side surfaces of the first and second pillars with an intervention of the second insulating film therebetween;
   removing a first part of the silicon film, the first part of the silicon film being located on upper surfaces of the first and second portions of the first insulating film;
   forming a coating film over the semiconductor substrate, the coating film covering the upper surfaces of the first and second portions of the first insulating film;
   removing a part of the coating film to expose the first insulating film and a second part of the silicon film, the second part of the silicon film being located on side surfaces of the first and second portions of the first insulating film; and
   removing the second part of the silicon film by dry etching.

2. The method according to claim 1, further comprising:
   before removing the first part of the silicon film, introducing p-type impurity into the silicon film disposed over the side surface of the first pillar to form a p-type silicon film, and introducing n-type impurity into the silicon film disposed over the side surface of the second pillar to form an n-type silicon film.

3. The method according to claim 2, wherein removing the first part of the silicon film is performed by dry etching of a first condition, the first condition being set to have a different etching rate between the silicon film and the second insulating film, an etching speed of the silicon film being faster than an etching speed of the second insulating film under the first condition.

4. The method according to claim 3, wherein the first condition is set to have a different etching rate between the p-type silicon film and the n-type silicon film, an etching speed of the n-type silicon film being faster than an etching speed of the p-type silicon film under the first condition.

5. The method according to claim 4, wherein the first condition is set to use a gas including chlorine.

6. The method according to claim 1, wherein the coating film is formed by spinning technique using an organic material.

7. The method according to claim 6, wherein removing the second part of the silicon film is performed by dry etching of a second condition, the second condition being set to have a different etching rate between the silicon film and the coating film, an etching speed of the silicon film being faster than an etching speed of the second insulating film under the second condition.

8. The method according to claim 6, wherein the second condition is set to use a gas including fluorine.

9. The method according to claim 7, wherein removing a part of the coating film is performed by dry etching using a gas including oxygen.

10. The method according to claim 7, further comprising:
after removing the second part of the silicon film, removing the coating film by an ashing process using a gas including oxygen.

11. The method according to claim 10, wherein the first insulating film is formed by a silicon nitride film.

12. The method according to claim 11, further comprising:
removing the coating film, the first insulating film is removed by wet etching process using heated phosphoric acid.

13. A method of manufacturing a semiconductor device, comprising:
forming a first insulating film on a semiconductor substrate, the first insulating film having first and second portions;
removing a part of the semiconductor substrate by using the first insulating film as an etching mask to form first and second pillars of the semiconductor substrate;
forming a second insulating film on side surfaces of the first and second pillars;
forming a silicon film on the first insulating film and the second insulating film, the silicon film facing to the side surfaces of the first and second pillars with an intervention of the second insulating film therebetween;
introducing p-type impurity into the silicon film disposed over the side surface of the first pillar to form a p-type silicon film;
introducing n-type impurity into the silicon film disposed over the side surface of the second pillar to form an n-type silicon film;
removing a first part of the silicon film by dry etching using a gas including chlorine, the first part of the silicon film being located on upper surfaces of the first and second portions of the first insulating film;
forming a coating film over the semiconductor substrate, the coating film covering the upper surfaces of the first and second portions of the first insulating film;
removing a part of the coating film to expose the first insulating film and a second part of the silicon film, the second part of the silicon film being located on side surfaces of the first and second portions of the first insulating film; and
removing the second part of the silicon film by dry etching using a gas including fluorine.

14. The method according to claim 13, further comprising:
after removing the second part of the silicon film, removing the coating film and the first insulating film; and
forming a PMOS transistor by using the first pillar as a channel region of the PMOS transistor, and forming an NMOS transistor by using the second pillar as a channel region of the NMOS transistor.

* * * * *